United States Patent [19]

Mellitz et al.

[11] Patent Number: 5,256,975
[45] Date of Patent: Oct. 26, 1993

[54] MANUALLY-OPERATED CONTINUITY/SHORTS TEST PROBE FOR BARE INTERCONNECTION PACKAGES

[75] Inventors: Richard I. Mellitz, Pepperell; Ellsworth W. Stearns, Hudson, both of Mass.

[73] Assignee: Digital Equipment Corporation, Maynard, Mass.

[21] Appl. No.: 891,632

[22] Filed: Jun. 1, 1992

[51] Int. Cl.⁵ .............................................. G01R 31/02
[52] U.S. Cl. ................................ 324/519; 324/158 R; 324/679; 324/672; 324/66; 371/25.1
[58] Field of Search ............... 324/537, 512, 522, 672, 324/679, 158 R, 519, 72.5, 66; 371/25.1

[56] References Cited

U.S. PATENT DOCUMENTS

| | | | |
|---|---|---|---|
| 3,975,680 | 8/1976 | Webb | 324/537 |
| 4,224,690 | 9/1980 | Rockwell | 371/25.1 |
| 4,342,959 | 8/1982 | Skilling | 324/537 |
| 4,565,966 | 1/1986 | Burr et al. | 324/158 F |
| 4,583,042 | 4/1986 | Riemer | 324/519 |
| 4,620,302 | 10/1986 | Binoeder et al. | 371/25.1 |
| 4,791,357 | 12/1988 | Hyduke | 371/25.1 |
| 5,138,266 | 8/1992 | Stearns | 324/537 |

FOREIGN PATENT DOCUMENTS

| | | | |
|---|---|---|---|
| 2143954A | 7/1983 | United Kingdom | 324/537 |
| 0199173 | 8/1989 | Japan | 324/519 |
| 4025775 | 1/1992 | Japan | 324/519 |
| 1645916 | 4/1991 | U.S.S.R. | 324/519 |

Primary Examiner—Kenneth A. Wieder
Assistant Examiner—Jose M. Solis
Attorney, Agent, or Firm—Arnold, White & Durkee

[57] ABSTRACT

A hand-held test probe is employed which uses a capacitance measuring circuit to measure capacitance as the probe is scanned along a pattern of conductors (pads or pins) at a steady rate. The capacitance measurement is stored in a memory during the scan, then maximums are detected in the stored data, corresponding to the conductor pattern. If a particular conductor has a short or a break in continuity, its capacitance will be more or less than it should be. The detected maximums are compared with recorded values for a known-good printed wiring board for this scan pattern. If the comparison shows a difference greater than a selected threshold, an error is indicated for this pin location. The known-good is scanned in a "learn" mode, in which the capacitance values are stored for each scan, identified by scan number.

18 Claims, 4 Drawing Sheets

MANUALLY-OPERATED CONTINUITY/SHORTS TEST PROBE FOR BARE INTERCONNECTION PACKAGES

BACKGROUND OF THE INVENTION

This invention relates to testing equipment for printed circuit boards or the like, and more particularly to a hand-held capacitance probe for continuity/shorts testing of interconnections at a face of boards having multiple conductors.

Printed (or etched) circuit boards are tested after manufacture of the board has been completed but before components are attached and assembly of the module is completed. The type of testing is primarily directed to determining whether or not all of the conductive paths are in their designated positions and no conductors are unintentionally shorted, and whether electrical continuity exists where it should. Various functional tests may be performed after the module is assembled using the external connectors (those included for operation in the end equipment), and also visual inspection can provide an indication of the quality of the part. However, such methods can be time-consuming and expensive, and in any event are not always effective in discovering shorts or opens which may be hidden form view or not exercised in the electrical functional tests chosen. If a circuit board has faults, it is always much cheaper to discover these prior to completing assembly of a module. For these reasons, various test mechanisms have been proposed which perform the function of scanning the surface of a circuit board and providing an indication of the wiring integrity.

The most widely used testing methods for production type testing of circuit boards make use of so-called bed-of-nails probes, where an array of closely-spaced pins is used to make contact with conductors on the board, or an X-Y prober along with a multimeter or capacitance meter. Also, continuous motion test equipment using X-Y motion systems and specialized position detection are available. These prior systems are very costly and cumbersome, and most require extensive software to customize applications. Because of the large number of diverse circuit boards, and the small conductor sizes now used, these prior methods have not provided viable solutions to the fast turn-around testing needed today.

In copending application Ser. No. 640,553, filed Jan. 14, 1991 (continuation of application Ser. No. 424,654, filed Oct. 20, 1989), by Ellsworth W. Stearns, now U.S. Pat. No. 5,138,266, a testing device is disclosed which uses a single probe charge measuring technique, where the amount of charge transferred when the probe contacts a node is detected.

In U.S. Pat. No. 5,017,863, issued from application Ser. No. 424,396, filed Oct. 20, 1989), by Richard I Mellitz, a testing device is disclosed which uses a laser beam impinging upon an electro-emissive grid to charge nodes of a printed wiring board, and this charge is detected to provide an indication of continuity or shorts.

In U.S. Pat. No. 4,229,693 a single-probe capacitance measurement method is described, used in testing of printed circuit boards. A probe is used to make contact to the conductors of the board to measure the capacitance to thereby detect open circuit and short circuit networks on the board. This technique, however, does not provide any facility for measuring any previous electrical states of the network being probed. Thus, when two or more networks have been identified as open or shorted, they must be located and verified with two probes using a resistance type of measurement. Further, this method requires that the capacitance values of each network be known. In order to acquire this data, a known good module must be available to obtain the capacitance values since they cannot easily be calculated, or a group of unknown modules may be used and the results analyzed to obtain the values. Commercial equipment available using this type of testing method includes a Teledyne TAC capacitance probing system.

Presently the lowest cost approach to verifying opens and shorts is a hand-held ohm meter. This is not a viable option for present-day printed wiring boards due to the large number and small size of the circuits on such boards.

SUMMARY OF THE INVENTION

According to one embodiment of the invention, a hand-held test probe is employed which uses a capacitance measuring circuit to measure capacitance as the probe is scanned along a pattern of conductors (pads or pins) at a steady rate. The capacitance measurement is stored in a memory during the scan, then maximums are detected in the stored data, corresponding to the conductor pattern. If a particular conductor has a short or a break in continuity, its capacitance will be more or less than it should be. The detected maximums are compared with recorded values for a known-good printed wiring board for this scan pattern. If the comparison shows a difference greater than a selected threshold, an error is indicated for this pin location. The known-good board is scanned in a "learn" mode, in which the capacitance values are stored for each scan, identified by scan number.

The hand-held tester of the invention offers a very low cost, quickly adaptable interconnect testing process. This is especially valuable when cost and time-to-market are critical. The method can be used for incoming inspection of prototype boards, new product start-up, and off-line verification of high volume bed-of-nails or other production test equipment. Ordinarily X-Y probers are used for this type of process, but the hand-held tester offers a test time reduction of a factor of ten, and will have almost no programming and support associated with it, compared to the large and expensive X-Y probers.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
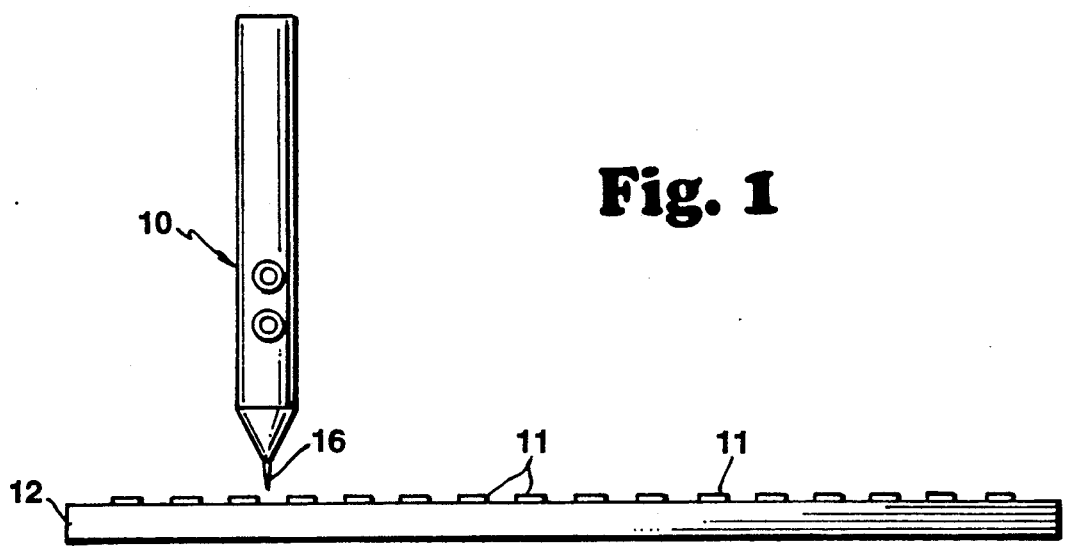
FIG. 1 is a diagram of a hand-held probe tester according to one embodiment of the invention.
Figure 2:
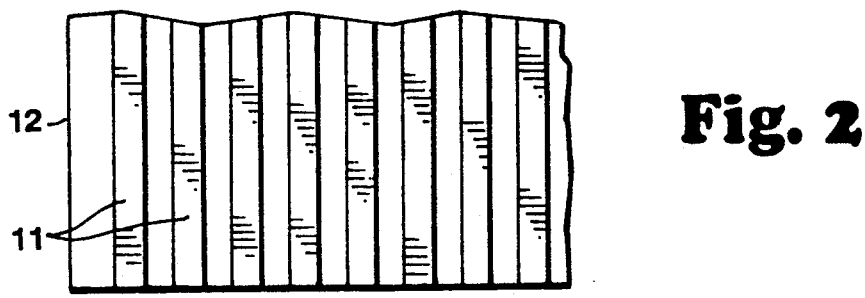
FIGS. 2 and 3 are plan views of conductor patterns on printed wiring boards which may be used in the test method of FIG. 1.
Figure 3:
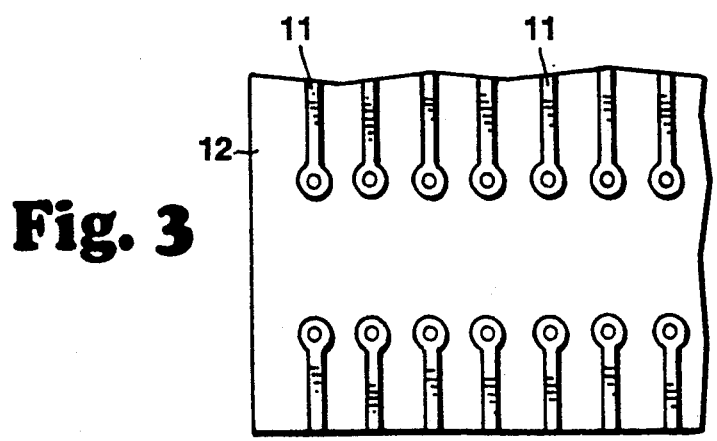
Figure 4:
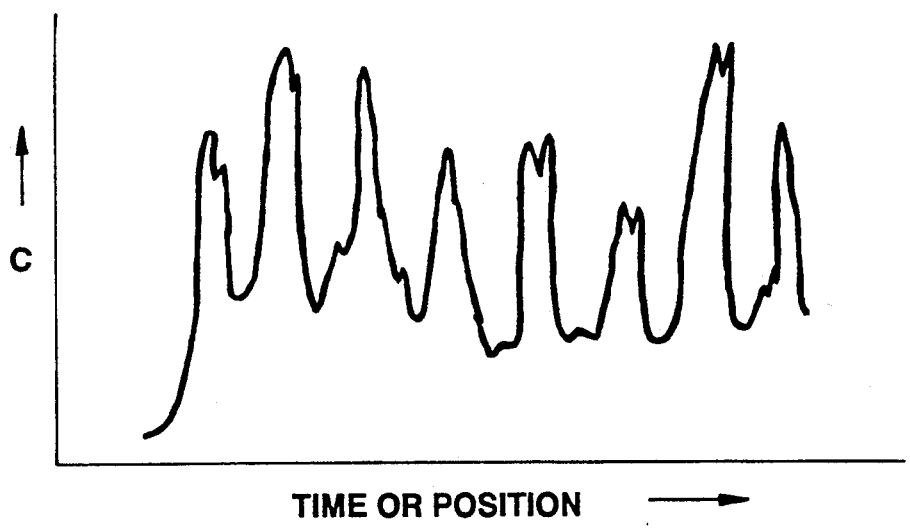
FIG. 4 is a timing diagram of capacitance vs. time for the probe method of FIG. 1, correlated with probe position.

Referring to FIGS. 1, 2 and 3, according to one embodiment of the invention, a hand-held probe 10 is used to test a large number of conductors 11 on a printed wiring board 12, by manually moving the probe 10 across the conductors 11 in a manner such that each conductor is touched for a time sufficient to detect the capacitance of the conductor. The conductors may be, for example, an edge connector as seen in FIG. 2 or an integrated circuit location having a number of pads as seen in FIG. 3. The probe 10 is guided across the conductors or pad sites in the same way a pencil would trace the outline of the device. The probe contains a capacitance measuring circuit producing an output as seen in FIG. 4, where the trace is a plot of capacitance as a function of time. The vertical dimension is proportional to capacitance. A "scan" of the probe across the row of conductors or pads 11 produces a capacitance profile of FIG. 4 with relative maximums 13 corresponding to the capacitance of the associated conductors. Differences between the capacitance profile of FIG. 4 and a predetermined profile are reported as pin errors on the pattern for this integrated circuit, for example, that are indicative of an open or a short. A "scan" might include one pad or conductor, or might include a row or column pattern of hundreds of pads. The limiting factors to the number of pads included in on manual scan are (1) the speed at which measurements can be made, i.e., the reaction time of the capacitance measuring circuitry, (2) the speed at which the pads are manually scanned by the user, (3) the size of the pads, i.e., larger pads will have greater capacitance and thus take longer to measure, and (4) the shape and size of the probe 10. It has been found that scans of 1-10 inches per second for 12-mil pitch printed wiring boards are appropriate.

Figure 5:
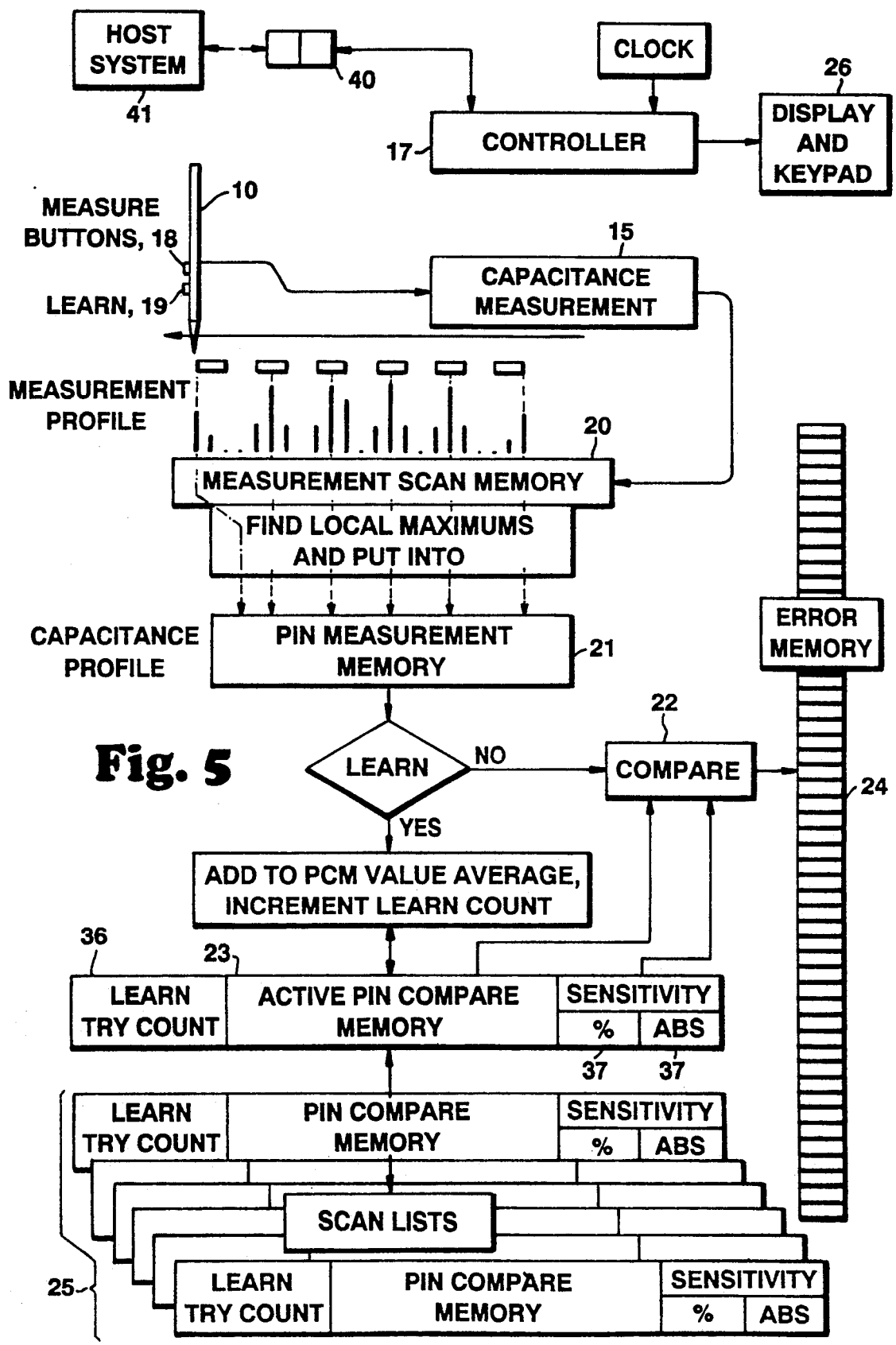
FIG. 5 is a block diagram of electrical circuitry used in the hand-held probe tester of one embodiment of the invention.

Referring to FIG. 5, the testing apparatus includes a capacitance measuring circuit of conventional construction; this circuit may measure capacitance by applying a high frequency to the tip 16 of the probe 10, or alternatively may measure the charge capacitance as set forth in the above-mentioned Pat. No. 5,017,863. A controller 17 operates the capacitance measurement circuit 16 and loads its output to memory as explained. This controller 17 may be a single-chip microcontroller such as an Intel 8031 or 8051, or the like, for example. The hand-held probe 10 has push-button switches 18 and 19 to initiate a "learn" mode and a "measure" mode as described below, and these switches are connected to the controller 17 to signal these operations. A digital representation of capacitance from the circuit 15 is loaded into a measurement scan memory 20, under direction of the controller 17, as the probe 10 is moved across the pads 11. The measurement scan memory 20 is checked continuously by the controller 17 to find local maximums (which indicate the pads or pins) and these peak values are loaded into a pin measurement memory 21, again under direction of the controller 17. When in the measurement mode (not in the learn mode), a compare circuit 22 receives each pin output from the memory 21 and compares it with a learned value from an active pin compare memory 23 containing values generated during learn mode. The output of the compare circuit 22 is loaded to an error memory 24, where each pin is separately identified. The active pin compare memory 23 can be loaded with any one of a number of different learned scans stored in scan list memory 25.

Figure 6:
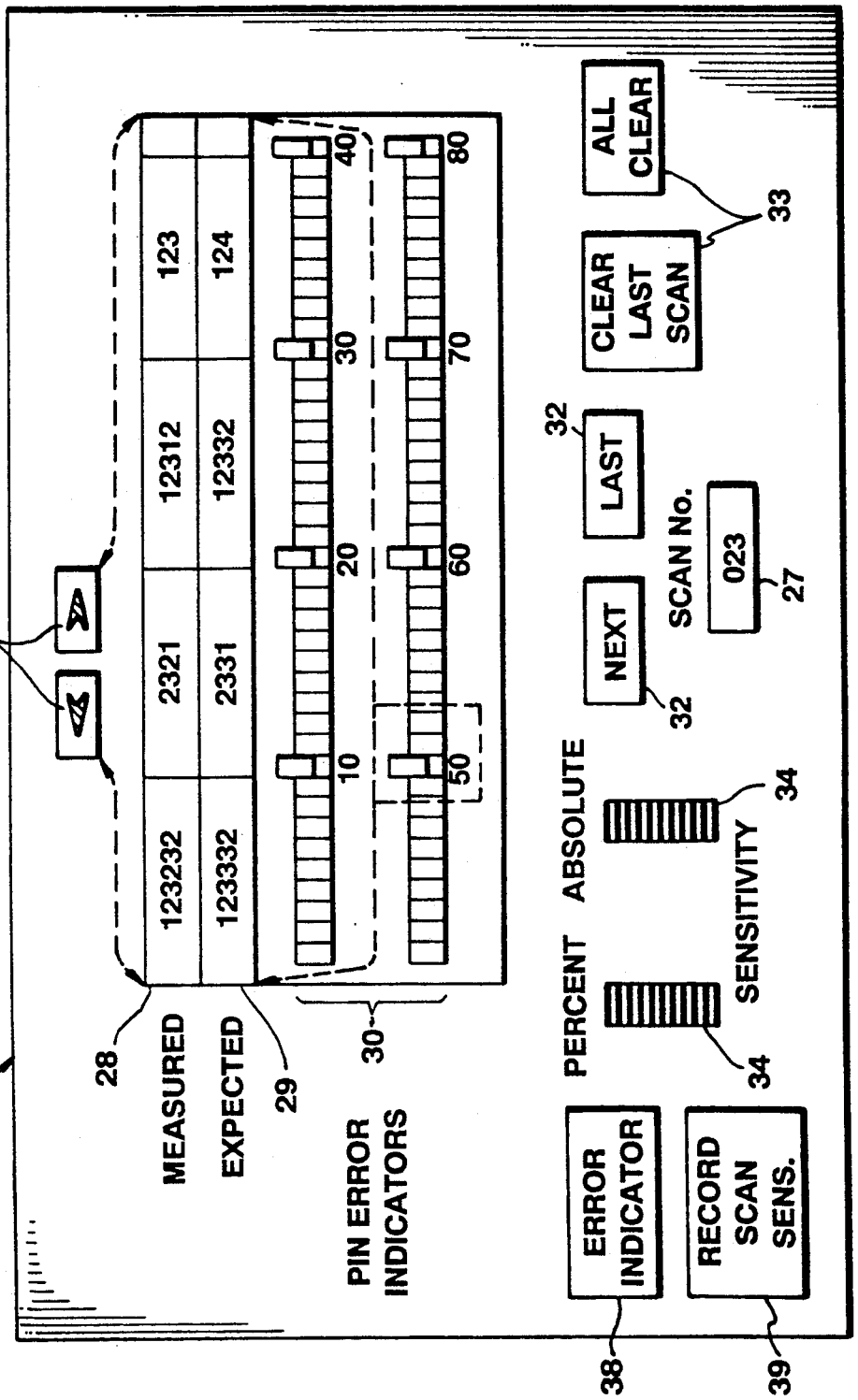
FIG. 6 is a diagram of a display and keyboard used with the system of FIG. 5.

The capacitance measurement circuit 15, memories 20, 21, 23, 24, 25 and the compare circuit 22, with the controller 17, are all contained in a suitable housing, and a display/keypad assembly 26 as seen in FIG. 6 is provided on this housing. This may use a commercially-available LCD display, operated by the controller 17. The display/keypad 26 shows the scan number at location 27, and shows the measured values from the memory 21 at location 28, and the expected values from the active pin memory 23 at location 29. Pin error indicators from output of the compare 22 as stored in the memory 24 are shown at location 30. Associated with the display/keypad are control buttons such as the arrows 31 to move the displayed list left or right (<<or >>), or to jump to the next scan or last scan, buttons 32. Buttons 33 provide clear-last-scan and clear-all functions. The sensitivity of the compare (threshold level for error indication) can be adjusted by thumb-wheels 34 which control the measured/expected percent error tolerance and the measured/expected absolute error tolerance. A light or beeper can be used to indicate errors as they occur (i.e., compare circuit 22 detects value differences. All of these keys or buttons and thumb-wheel adjustments are inputs to the controller 17, and operate in a conventional manner.

Operation of the test device of FIGS. 1-6 in the learn mode is for the purpose of finding the desired values of capacitances of the pins or pads 11 and storing these values in the pin compare memory 23. First, the learn button 19 is pressed by the user, which may toggle a learn indicator light on the display/keypad 26 or the probe 10 itself. A scan number is selected by the buttons 32, using the number display 27, to associate a scan number with a scan operation at a particular location on a printed wiring board 12. The user ordinarily keeps track of which scan number corresponds to what board location, or this process may be automated via a communication port to a host processor. A program such as a CAD (computer aided design) system can be used to guide the scan selection. A clear-last-scan operation with the learn indicator on clears the pin compare memory 23, a learn try counter 36, scan number 27 for this memory, and sensitivity values set in fields 37 by wheels 34, for the current element in memory 23. An all-clear operation by button 33 clears all of these for the entire scan list in memory 25.

In this learn mode, the probe 10 is traced over the desired row, column, or other pattern of pads for this scan number. Just before the first pad 11 is reached, the measure button 18 is depressed. Once the measure button 18 is depressed, the capacitance measurement circuit 15 is free running and the output is continually shifted into the measurement scan memory 20. The controller 17 is counting clocks and operator errors are indicated if the scan takes too much time and the memory 20 fills up. The corrective action needed in this case is to do a retrace and move the probe a bit faster.

The next step of the learn mode, after a scan is completed, is to release the measure button 18. The controller 17 completes its scan of the measurement scan memory 20 and finds the local maximums and the spacings between maximums. If the spacings are not regular and continuous, operator errors are indicated. The corrective action is to reprobe with a smoother or slower motion. The exception to the error indication is if no relative maximum is found at spacings where one would be thought to exist; this may be the case for an unused or power pad. Note that the spacing of the relative maximums corresponds to the physical spacing of each pad.

If no operator errors are reported after a scan in the learn mode, the average represented by the active pin compare memory 23 is adjusted by the addition of the values in the pin measurement memory 21. In one embodiment, this is done by (1) incrementing the learn try count 36, (2) multiplying the old values in the pin compare memory 23 by the learn count 36 minus one, (3) the pin measurement memory 21 is added to the quotient, and (4) the new values of the pin compare memory 23 are replaced with the previous sums divided by the learn try count 36. Also, the values 37 corresponding to the sensitivity wheels 34 for the pin compare memory 23 are overwritten.

Each row or column pattern of pads may be scanned in this manner in the learn mode a few times to get a good value for the pin compare memory 23. Then the learn button 19 is depressed again indicating normal testing is to occur.

Appropriate settings for the sensitivity wheel values in fields 37 are found by testing (as described below) the selected row or column pattern of pads a few times until no pin errors are indicated. The wheel values are recorded by depressing a button 38.

This sequence as just described is repeated in the learn mode for each one of the row or column patterns (each scan number) for the printed wiring board in question. The scan number is incremented or decremented by the next and last buttons 32. An alternative would be to load the scan list 25 from an external host processor via a communications port. In any event, data is now in storage (in scan list 25) so that a testing operation can begin.

In a testing operation (i.e., not in learn mode), the user scans each row or column pattern of pads 11 by first selecting a scan number using the buttons 32. As mentioned above, the user keeps track of the location on the printed wiring board of each scan number. A clear operation with the learn mode off only clears the memory for the active scan number value indicated at 27. When a new number is shown on the indicator 27 by use of the next/last buttons 32, the active pin compare memory 23 is loaded from the scan list 25 for the new number.

In this test mode, the probe 10 is traced over the desired row, column, or other pattern of pads associated with the selected scan number. Just before the first pad 11 is reached, the measure button 18 is depressed. Once the measure button 18 is depressed, the capacitance measurement circuit 15 is free running and the output is continually shifted into the measurement scan memory 20. The controller 17 is counting clocks and operator errors are indicated by a light 39 or beep if the scan takes too much time and the memory 20 fills up. As in learn mode, the corrective action needed in this case is to do a retrace and move the probe a bit faster.

The next step of the test mode, after a scan is completed, is to release the measure button 18. The controller 17 completes its scan of the measurement scan memory 20 and finds the local maximums and the spacings between maximums. If the spacings are not regular and continuous, operator errors are indicated by light 39. The corrective action is to reprobe with a smoother or slower motion.

When a good scan is completed in the test mode (no operator error indications by light 39), the controller 17 causes the values in the pin measurement memory 21 to be compared to the corresponding values in the active pin compare memory 23, using the comparator 22. The absolute difference is first determined, and an error is signalled (recorded in memory 24) if the difference is greater than the sum of (a) the value in the active pin compare memory 23 times the percent sensitivity value from field 37, and (b) the absolute sensitivity value from field 37. All errors from a single scan are displayed by pin error indicators 30 so the position of the indicator display 30 represents the position/location and type of pad of the scan.

Each row or column pattern of pads on the printed wiring board 12 is scanned in this manner, in the test mode, until the entire board has been tested. If the operator gets a pin error indication, the scan at that location may be repeated in insure validity.

As discussed above, the test probe apparatus of FIGS. 1-6 may be a separate stand-alone unit, or it may be connected by an RS-232 connection 40, or local area network or the like, to a host processor 41, as seen in FIG. 6.

The apparatus and method described above, according to the invention, provides a simple and fast method for validating a vendor's quality for printed wiring boards. Thus a quick turn-around of rejects is provided. The hardware for prior method cost hundreds of times more than that of the hand-held tester described above. This hand-held tester may be constructed for a cost in the range of one or two thousand dollars, whereas the prior testers cost upwards of $100,000. Often fixtures and related CAD/test software support services that are required to adapt a new product for test takes many weeks. The hand-held tester of the invention offers an opportunity to provide reliable results in a few hours. Thus time to market with new products can be reduced.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. A hand-held test device for detecting continuity or shorts in conductors of printed circuit boards or the like, comprising:

a manually operated probe having a conductive point for scanning along one of a preselected set of patterns of said conductors in a regular rate;

means connected to said point for measuring capacitance of each conductor touched and for producing an electrical output corresponding thereto;

first memory means for storing said electrical output as a sequence of values, one value for each conductor touched;

means for scanning said first memory and detecting maximums in the stored electrical outputs and for storing in a second memory an indication of said sequence of maximums;

a third memory for storing a sequence of maximums of capacitance values for a known-good circuit board having said one of a preselected set of patterns of said conductors;

a comparator responsive to the contents of said second memory and the contents of said third memory for comparing said indications of said maximums with said sequence of maximums and producing a error indication for differences; and said device including a scan memory for separately storing a sequence of maximums of capacitance values for each one of said preselected set of patterns of said conductors for said known-good circuit board.

2. A method of operating a hand-held test device for detecting continuity or shorts in a set of patterns of conductors on a test circuit board, compared to a known-good circuit board having the same set of patterns of conductors, comprising the steps of:

(a) manually scanning a hand-held probe having a conductive point separately along each one of said set of patterns of said conductors of said known-good circuit board at a regular rate; and, for each said step of separately manually scanning:

(i) measuring capacitance of each conductor touched and producing an electrical output corresponding thereto;

(ii) storing said electrical output as a sequence of values, one value for each conductor touched, then detecting maximums in the stored electrical outputs and storing an indication of said sequence of reference maximums;

(ii) separately storing in a scan memory said sequence of reference maximums of capacitance values for each one of said set of patterns of said conductors for said known-good circuit board;

(b) again manually scanning said hand-held probe separately along each one of said set of patterns of said conductors of said test circuit board at a regular rate; and, for each said step of again manually scanning:

(i) measuring capacitance of each conductor touched and producing an electrical output corresponding thereto;

(ii) storing said electrical output as a sequence of values, one value for each conductor touched, then detecting test maximums in the stored electrical outputs and storing an indication of said sequence of test maximums;

(iii) detecting differences between said sequence of test maximums and one of said sequences of said reference maximums, and producing a error indication for detected differences.

3. A device according to claim 1 including means for selectively loading a sequence from said scan memory to said third memory.

4. A device according to claim 3 including means for storing with each said sequence a sensitivity value indicating a threshold for producing said error indication, said comparator being responsive to said sensitivity value.

5. A device according to claim 3 including means for invoking a "learn" mode to generate said sequence of maximums in said third memory.

6. A device according to claim 5 including means for generating an average value of each of said maximums in said third memory in said "learn" mode.

7. A device according to claim 6 including means for storing in said third memory a count of the number of scans in said "learn" mode for said selected one of said patterns.

8. A method of operating a hand-held test device for detecting continuity or shorts in conductors of printed circuit boards or the like, comprising the steps of:

manually scanning a hand-held probe having a conductive point along one of a preselected set of patterns of said conductors at a regular rate;

measuring capacitance of each conductor touched and producing an electrical output corresponding thereto, by means connected to said point;

storing said electrical output in first memory means as a sequence of values, one value for each conductor touched;

scanning said first memory and detecting maximums in the stored electrical outputs and storing in a second memory an indication of said sequence of maximums;

storing in a third memory a sequence of maximums of capacitance values for a known-good circuit board having said one of a preselected set of patterns of said conductors;

comparing the contents of said second memory and the contents of said third memory for detecting differences between said indications of said maximums and said sequence of maximums, and producing a error indication for detected differences; and including the step of separately storing in a scan memory a sequence of maximums of capacitance values for each one of said preselected set of patterns of said conductors for said known-good circuit board.

9. A method according to claim 2 including the step of selectively loading one of said sequences of reference maximums to a temporary memory before said step of detecting differences.

10. A method according to claim 8 including the step of selectively loading a sequence from said scan memory to said third memory.

11. A method according to claim 10 including the step of storing with each said sequence a sensitivity value indicating a threshold for producing said error indication, said comparator being responsive to said sensitivity value.

12. A method according to claim 10 including the step of invoking a "learn" mode to generate said sequence of maximums in said third memory.

13. A method according to claim 12 including the step of generating an average value of each of said maximums in said third memory in said "learn" mode.

14. A method according to claim 13 including the step of storing in said third memory a count of the number of scans in said "learn" mode for said selected one of said patterns.

15. A method according to claim 9 including the step of storing with each said sequence of reference maximums a sensitivity value indicating a threshold for producing said error indication, said step of detecting differences being responsive to said sensitivity value.

16. A method according to claim 15 including the step of invoking a "learn" mode to generate said sequence of reference maximums.

17. A method according to claim 16 including the step of generating an average value of each of said reference maximums in said "learn" mode.

18. A method according to claim 17 including the step of storing a count of the number of scans in said "learn" mode for each one of said patterns of conductors of said test board.

* * * * *